US005793220A

United States Patent [19]
Thompson, Sr.

[11] Patent Number: 5,793,220
[45] Date of Patent: Aug. 11, 1998

[54] FIXTURE FOR TESTING AND PREPPING LIGHT-EMITTING DIODES

[75] Inventor: Curtis C. Thompson, Sr., Meridian, Id.

[73] Assignee: Micron Electronics, Inc., Nampa, Id.

[21] Appl. No.: 695,613

[22] Filed: Aug. 12, 1996

[51] Int. Cl.$^6$ ............................................. G01R 31/26
[52] U.S. Cl. ............................................. 324/767; 324/755
[58] Field of Search ............................ 324/755, 765–769; 439/56, 57, 619

[56] References Cited

U.S. PATENT DOCUMENTS

| | | | |
|---|---|---|---|
| 3,388,366 | 6/1968 | Mitchell | 439/57 |
| 5,038,101 | 8/1991 | Murphy | 324/755 |
| 5,061,189 | 10/1991 | Iio et al. | 439/57 |
| 5,116,229 | 5/1992 | Savage, Jr. | 439/56 |
| 5,121,311 | 6/1992 | Cheselske | 439/56 |
| 5,184,065 | 2/1993 | Chism | 324/754 |
| 5,331,529 | 7/1994 | Huang | 439/619 |
| 5,453,695 | 9/1995 | Sparling et al. | 324/755 |

*Primary Examiner*—Ernest F. Karlsen
*Assistant Examiner*—Anh Phung
*Attorney, Agent, or Firm*—Seed and Berry LLP

[57] ABSTRACT

A device and method for configuring the leads of a light-emitting diode into a desired configuration and testing the polarity of the light-emitting diode before it is mounted to a printed circuit board. In one embodiment, the device has a non-conductive base that has a top surface with a first deformation point defining a location about which a hot lead is desirably deformed and a second deformation point defining a second location about which a ground lead is desirably deformed. The configuring and testing device also has a guide structure on the top surface of the base member, a first peg connected to the base member at the first deformation point, a first conductive contact element positioned to engage the hot lead, a second peg connected to the base member at the second deformation point, and a second conductive contact element positioned to engage the ground lead. The first conductive contact element is coupled to a positive terminal of a power supply, and the second conductive contact element is coupled to a ground terminal of a power supply. In operation, the guide structure retains the light-emitting diode element in a test, and configuration position such that the hot and ground leads are positioned adjacent to the first conductive contact element and the second conductive contact element, respectively. The polarity of the light-emitting diode is tested by energizing the first conductive contact element, and if the polarity of the light-emitting display is correct, the leads are then deformed about the first and second pegs to configure the leads into a desired configuration.

15 Claims, 3 Drawing Sheets

FIXTURE FOR TESTING AND PREPPING LIGHT-EMITTING DIODES

TECHNICAL FIELD

The present invention relates to a fixture that tests the polarity of a light-emitting diode and provides a platform upon which the leads of the light-emitting diode are configured for installation on a printed circuit board.

BACKGROUND OF THE INVENTION

Many electronic devices use light-emitting diodes ("LEDs") to convert electricity into visible light. LEDs are often mounted to a printed circuit board ("PCB") in an electronic device by soldering leads from the LEDs to appropriate contact points on the PCBs. The LED leads are generally bent to position the LED at an optical window of the electronic device, and to relieve stress at the soldered contact points on the PCB. To appropriately configure the LED leads for mounting the LEDs to a PCB, the leads are "prepped" by bending the leads at predetermined locations prior to mounting the LEDs to the PCBs.

LEDs are typically prepped by manual processes in which an operator uses a conventional prepping fixture to manually deform the leads into a desired configuration. Conventional prepping fixtures have a base, a depression in the top of the base for receiving an LED element, and a number of pegs positioned at select points on the base with respect to the depression in the base. In a typical prepping process, the operator visually observes the polarity of the LEDs by noting a polarity indicator on the LED. The operator then positions the LED element in the depression on the base and bends the leads around the pegs into a desired configuration. After the LED leads are configured, they are soldered to the contact points on a PCB in a manner that positions the LED element at an optical window of the electronic device.

A primary objective of electronic device manufacturing is to maximize the yield of finished products that perform their intended purposes. The yield is a function of the throughput and the percentage of defective finished products. It will be appreciated that it is desirable to maximize the throughput and minimize the number of defective products to improve the yield.

One problem with conventional LED prepping processes is that the operators may incorrectly position the LED element on the prepping fixture so that the leads are deformed with reversed polarity. It will be appreciated that when the LED leads are deformed with reversed polarity, the LED will be connected to the PCB with the reversed polarity because the LED element must be positioned at its corresponding optical window. As a result, when the LED leads are deformed with reversed polarity, single color LEDs will not emit light and multi-color LEDs will emit the incorrect color of light. Therefore, the incorrect prepping of a single LED causes an entire PCB assembly to be defective, and it greatly reduces the yield of the manufacturing process.

In light of the problem with conventional LED prepping fixtures and processes, it would be desirable to develop an apparatus and method that reduces the number of LEDs that are mounted to PCBs with reverse polarity.

SUMMARY OF THE INVENTION

The present invention is a device and method for configuring the leads of an LED into a desired configuration and testing the polarity of the LED before it is mounted to a printed circuit board. In one embodiment, the device has a non-conductive base that has a top surface with a first deformation point and a second deformation point. The first deformation point defines a location about which a first voltage lead is desirably deformed and the second deformation point defines a second location about which a second voltage lead is desirably deformed. The configuring and testing device also has a guide structure on the top surface of the base member, a first peg connected to the base member at the first deformation point, a first conductive contact element positioned to engage the first voltage lead in a test position, a second peg connected to the base member at the second deformation point, and a second conductive element positioned to engage the second voltage lead in the test position. The first conductive contact element is coupled to one terminal of a power supply (e.g., a positive terminal), and the second conductive contact element is coupled to a second terminal of the power supply (e.g., a ground terminal). In a preferred embodiment, the first conductive contact element is a first deformation element of the first peg, and the second conductive contact element is a second deformation element of the second peg.

In operation, the guide structure retains the LED element in a test and configuration position such that the first and second voltage leads are positioned adjacent to the first conductive contact element and the second conductive contact element, respectively. The polarity of the LED is initially tested by energizing the first conductive contact element, and if the polarity is correct, the leads are then deformed about the first and second pegs to configure the leads into a desired configuration. If the polarity is incorrect, the LED removed from the fixture, repositioned on the fixture to reverse the orientation of the leads with respect to the pegs, and then the leads are deformed into the desired configuration.

DETAILED DESCRIPTION OF THE INVENTION

The present invention is a fixture for configuring the leads of an LED and for testing the polarity of the leads prior to installing the LED on a PCB. One important aspect of an embodiment of the invention is to connect a first conductive contact element on a testing fixture to a first voltage terminal of a power supply and a second conductive contact element to a second voltage terminal of the power supply. Another important aspect of a preferred embodiment of the invention is to configure a plurality of pegs on the test fixture so that: (1) the leads may be bent into a desired configuration; (2) the first voltage lead is biased against the first conductive contact element; and (3) the second voltage lead is biased against the second conductive contact element. By configuring the pegs in an appropriate pattern, and by connecting selected conductive contact elements to the first and second voltage terminals of a power supply, the polarity of the LED may be tested in the fixture prior to deforming the leads. FIGS. 1–5, in which like reference numbers refer to like parts throughout the various figures, illustrate embodiments of LED configuring and testing fixtures in accordance with the invention.

Figure 1:
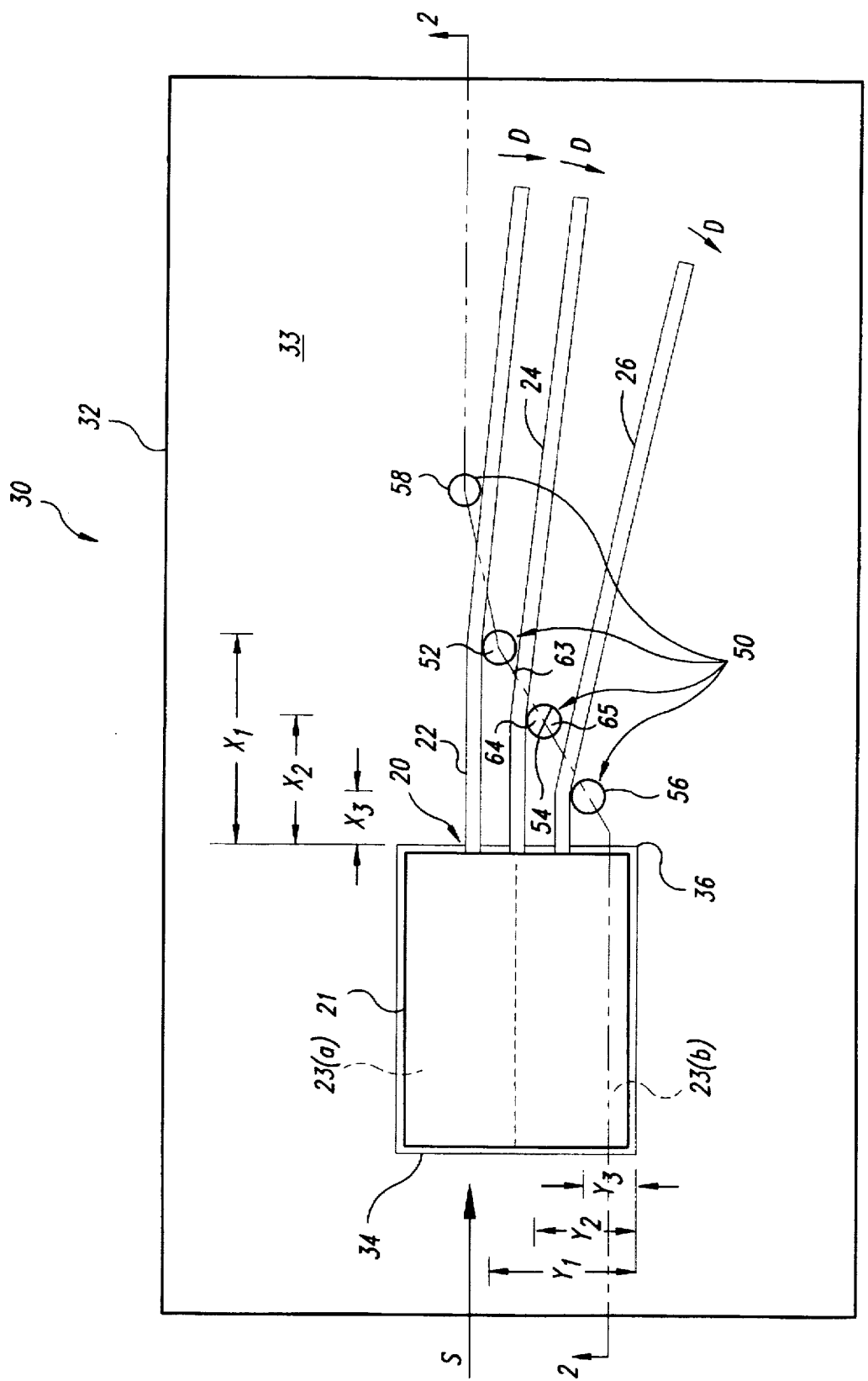
FIG. 1 is a plan view of a configuring and testing fixture in accordance with an embodiment of the invention.
Figure 2:
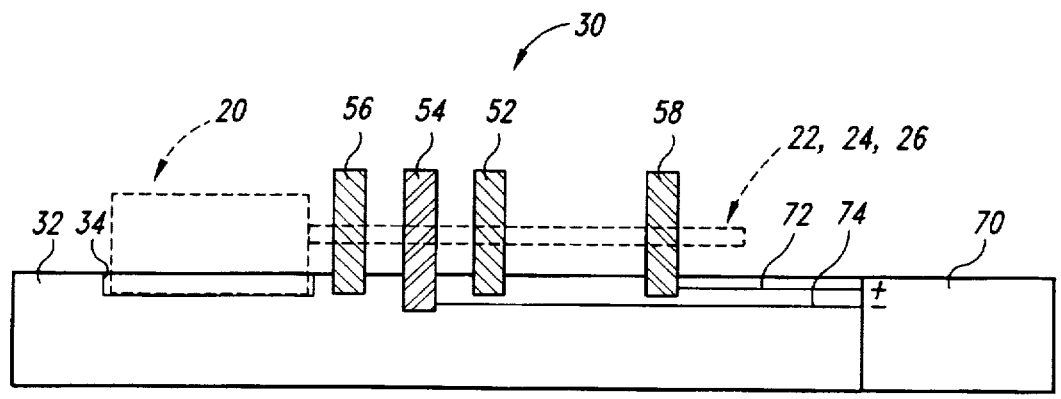
FIG. 2 is a cross-sectional view along line 2—2 of the configuring and testing fixture of FIG. 1.

FIGS. 1 and 2 illustrate a multi-color LED package 20 mounted to a configuring and testing fixture 30 in accordance with one embodiment of the invention. The multi-color LED package 20 has an LED element 21 (FIG. 1) with a first light-emitting diode 23(a) that emits one color of light and a second light-emitting diode 23(b) that emits another color of light. The multi-color LED package 20 also has a number of leads 22, 24, and 26 electrically coupled to the first and second light-emitting diodes 23(a) and 23(b). In a typical LED package 20, a first lead 22 and a common lead 24 are coupled to the first light-emitting diode 23(a), and a second lead 26 and the common lead 24 are coupled to the second light-emitting diode 23(b). The polarity of the multi-color LED package 20 is typically indicated by making one of the first or second leads shorter than the other two leads. As shown in FIG. 1, for example, the second lead 26 is shorter than the first lead 22 and the common lead 24 to indicate that the second lead 26 is coupled to the second light-emitting diode 23(b).

As discussed above, it is important to deform the leads according to the correct polarity so that the first and second leads 22 and 26 will be installed at the appropriate contact points on a PCB (not shown). Otherwise, if the polarity of the LED package 20 is reversed, the first lead 22 will be soldered to the contact point for the second lead 26, and the second lead 26 will be soldered to the contact point for the first lead 22. As a result, the LED package 20 will emit the wrong color of light (e.g., the color of the second light-emitting diode 23(b) instead of the color of the first light-emitting diode 23(a), and the color of the first light-emitting diode 23(a) instead of the color of the second light-emitting diode 23(b)).

Still referring to FIGS. 1 and 2, the configuring and testing fixture 30 has a base member 32 with a top surface 33, a guide structure 34 on the top surface 33, and a plurality of pegs 50 connected to the base member 32. The base member 32 is preferably a block of non-conductive material such as wood, plastics, rubber and other non-conductive materials. The guide structure 34 on the top surface 33 is preferably a recess shaped to receive the LED element 21 and to position the leads 22, 24, and 26 with respect to the pegs 50. The guide 34 may alternatively be a frame (not shown) or housing (not shown) that is mounted to the base 32 to hold and position the LED element 21 and the leads 22, 24, and 26. The guide 34 may also be formed by markings (not shown) on the base 32 which indicate where the LED element 21 should be positioned.

In this embodiment of the invention, the pegs 50 more specifically include a first peg 52, a second peg 54, a third peg 56, and a fourth peg 58. The first peg 52 is preferably an insulator peg positioned at a first deformation point about which the first lead 22 is desirably deformed. The second peg 54 is preferably a conductive contact element coupled to a common terminal of a power supply 70, such as ground, by line 74 (FIG. 1), and it is positioned at a second deformation point about which the common lead 24 is desirably deformed. The third peg 56 is preferably an insulator peg positioned at a third deformation point about which the second lead 26 is desirably deformed. The fourth peg 58 is another conductive contact element coupled to a first terminal of the power supply 70 by line 72, and it is positioned to engage the first lead 22 when the LED package 20 is in the guide 34.

In a preferred embodiment of the fixture 30, the first peg 52 is shaped and positioned so that a contact surface 63 pushes the common lead 24 against the second peg 54. Additionally, the second peg 54 preferably has a separate conductive contact element 64 and a separate insulated contact element 65. The conductive contact element 64 is coupled to the common terminal of the power supply 70, and it acts as a deformation element about which the common lead 24 is deformed. The insulative contact element 65 engages the second lead 26 to prevent the second lead 26 from contacting the conductive deformation element 64.

FIG. 1 illustrates only one example of a guide 34 and a plurality of pegs 50 to configure and test a multi-color LED package 20 with three leads. In more general terms, the pegs 50 are shaped and positioned with respect to the guide 34 to provide deformation elements at points about which the leads are deformed into a desired configuration. For example, the first, second, and third deformation points are positioned with respect to a reference point 36 on the guide 34 by coordinates $X_1$-$Y_1$, $X_2$-$Y_2$, and $X_3$-$Y_3$, respectively. It will be appreciated that the actual coordinates, and thus the positions of the pegs 50 on the base 32, depends upon the specific application and LED package.

Additionally, selected pegs preferably have conductive contact elements and insulated contact elements. The conductive contact elements electrically couple first and second leads to a power supply, and the insulative components electrically isolate the conductive contact elements from contacting undesired leads. A peg may accordingly be solely a conductive or insulative component of the fixture, or it may have separate insulative and conductive components. Lastly, the pegs 50 may also be shaped to bias selected leads against appropriate pegs to simultaneously test the polarity of the LED and configure the pegs. The pegs 50, therefore, are not limited to cylindrical shapes as shown in FIG. 1.

To configure and test the LED package 20, an operator (not shown) slides the LED package 20 across the top surface 33 of the base 32 in the direction of arrow S until the LED element 21 is positioned in the guide 34. As the operator slides the LED package 20, the operator positions the leads 22, 24, and 26 between the appropriate pegs 50. More specifically, the first lead 22 is positioned between the fourth peg 58 and the first peg 52, the common lead 24 is positioned between the first peg 52 and the second peg 54, and the second lead 26 positioned between the second peg 54 and the third peg 56. The fourth peg 58 is then energized from the power supply 70 to illuminate the first light-emitting diode 23(a) and test the polarity of the LED package 20. The operator observes the light emitted from the tested light-emitting diode to determine if the actual light emitted from the light-emitting diode corresponds to the expected light for the first light-emitting diode 23(a). If the polarity of the LED package 20 is correct and it emits the correct color of light, the operator then deforms the leads 22, 24, and 26 around the first, second and third pegs 52, 54, and 56, respectively. After the leads are deformed, the operator simply lifts the LED package 20 from the fixture 30 to clear the fixture for the next LED package.

One advantage of the fixture 30 is that the polarity of an LED package can be functionally tested before the leads are deformed. Unlike conventional fixtures, the fixture 30 of the present invention illuminates the LED to provide a definite indication of the polarity of the LED package. The configuring and testing fixture 30 accordingly ensures that the LED leads will be deformed into the appropriate configuration to mount the LED package to a PCB with the correct polarity. Therefore, the configuring and testing fixture 30 reduces the number of defectively deformed LED packages and increases the yield of finished PCBs.

Another advantage of the configuring and testing fixture 30 is that it is relatively inexpensive to manufacture and operate. Compared to conventional prepping fixtures, the configuring and testing fixture of the invention does not require a significant number of additional or expensive components to functionally test the polarity of an LED package. Moreover, the configuring and testing fixture 30 does not require the operator to perform additional time-consuming steps to test the polarity of LED packages. Thus, the configuring and testing fixture 30, and the method of operating the fixture, do not reduce the throughput of finished LED packages or assembled PCBs.

Figure 3:
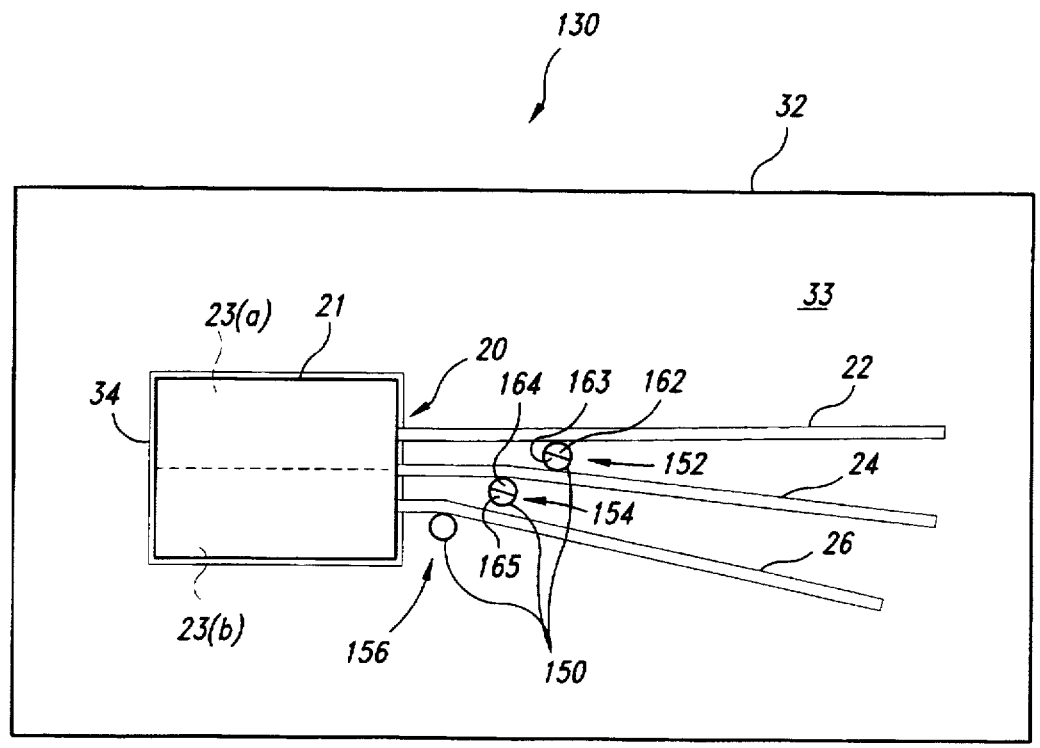
FIG. 3 is a top plan view of another embodiment of a configuring and testing fixture in accordance with the invention.

FIG. 3 illustrates another configuring and testing fixture 130 in accordance with another embodiment of the invention for testing and configuring the multi-color LED package 20. In this embodiment, three pegs 150 are attached to the base 32. The pegs 150 include a first peg 152 that has a conductive contact element 162 coupled to a first terminal of a power supply. The conductive contact element 162 is also a deformation element positioned at the first deformation point to provide a surface about which the first lead 22 may be deformed. The first peg 152 also has an insulative contact element 163 shaped and positioned to bias the common lead 24 downwardly. The pegs 150 also include a second peg 154 that has a conductive contact element 164 coupled to a common terminal of the power supply. The conductive contact element 164 is also a deformation element positioned at the second deformation point to provide a surface about which the common lead 24 may be deformed. The second peg 154 also has an insulated contact element 165 shaped and positioned to engage the second lead 26 and electrically isolate the second lead 26 from the other conductive components. A third peg 156 is positioned at the third deformation point to engage the second lead 26. The third peg 156 is substantially the same as the third peg 56 illustrated in FIGS. 1 and 2. The configuring and testing device 130 shown in FIG. 3 operates substantially in the same manner as the configuring and testing fixture 30 illustrated in FIGS. 1 and 2.

Figure 4:
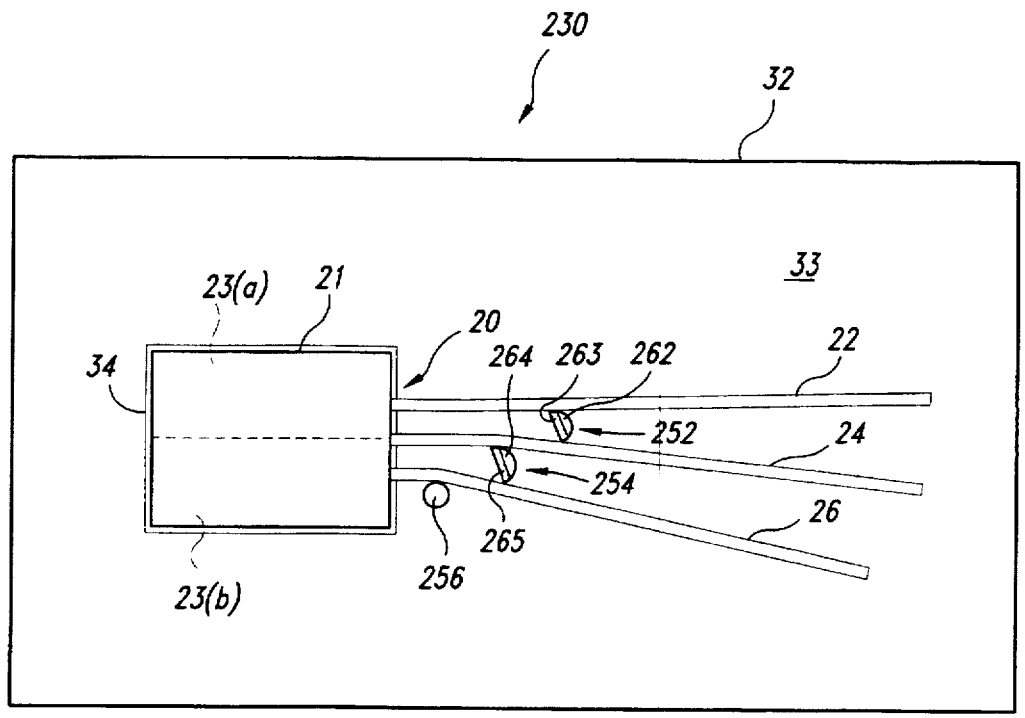
FIG. 4 is a top plan view of another embodiment of a configuring and testing fixture in accordance with the invention.

FIG. 4 illustrates another configuring and testing fixture 230 in accordance with another embodiment of the invention in which first and second pegs 252 and 254 are shaped to bias the leads 22, 24, and 26 into a desired testing configuration as the LED package 20 slides into position. The first peg 252 has a conductive contact element 262 positioned at the first deformation point. The conductive contact element 262 acts as a deformation element that has a shape to bias the first lead 22 slightly upwardly with respect to the recess 34. The first peg 252 also has an insulated contact element 263 that is a flat face positioned to guide the common lead 24 downwardly and into contact with another conductive contact element 264 of the second peg 254. The second peg 254 also has an insulated flat-faced conductive element 265 positioned to prevent the second lead 26 from contacting the other leads 22 and 24, and to bias the second lead 26 against a third peg 256. The configuration and testing device 230 illustrated in FIG. 4 operates in the same manner as discussed above with respect to the configuration and testing device 30 illustrated in FIGS. 1 and 2.

Figure 5:
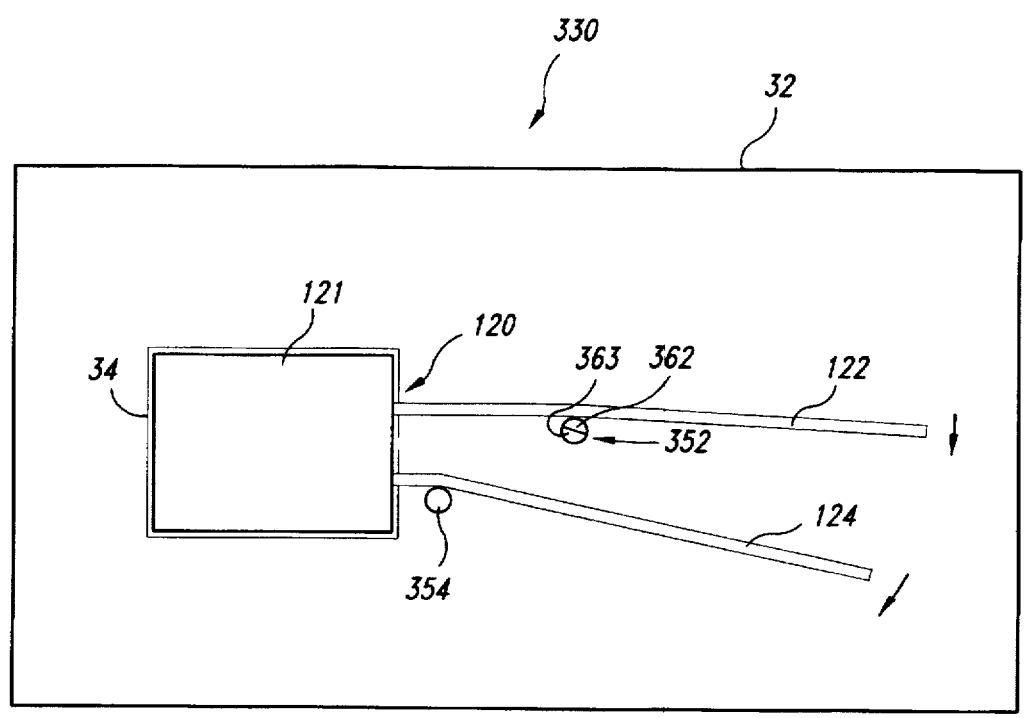
FIG. 5 is a top plan view of another embodiment of a configuring and testing fixture in accordance with the invention.

FIG. 5 illustrates a configuration and testing device 330 in accordance with the invention for testing either a single color or two color, polarity sensitive LED package 120 with an LED element 121, a first lead 122, and a second lead 124. The configuration and testing fixture 330 has a first peg 352 positioned at a first deformation point and a second peg 354 positioned at a second deformation point. The first peg 352 may be solely a conductive peg that acts as a conductive contact element, or it may have a conductive contact element 362 and an insulated segment 363. The second peg 354 is preferably solely a conductive peg that acts as another conductive contact element. The conductive contact element 362 is coupled to a first terminal of a power supply (not shown), and the conductive second peg 354 is coupled to a second terminal of the power supply. The first and second pegs 352 and 354 are positioned with respect to the recess 34 based upon the same factors as discussed above with respect to the configuration and testing fixture 30 illustrated in FIGS. 1 and 2.

In operation, an operator slides the LED package 120 across the top surface 33 of the base 32 and positions the leads 122 and 124 adjacent to the first and second pegs 352 and 354, respectively. The first peg 352, or the conductive contact element 362 of the first peg 352, is energized to illuminate the LED. If the LED package 120 is mounted properly to the fixture 330, the LED will illuminate with the proper color. If the polarity of the LED package 120 is incorrect, the LED will simply not be illuminated or it will be illuminated with the wrong color. After the operator mounts the LED package correctly to the fixture 330, the operator deforms the leads 122 and 124 around the first and second pegs 352 and 354, respectively.

From the foregoing it will be appreciated that, although specific embodiments of the invention have been described herein for purposes of illustration, various modifications may be made without deviating from the spirit and scope of the invention. For example, the fixture could be adapted to operate with automated lead bending machinery by adding a light sensor capable of distinguishing between two colors. The fixture of the invention would accordingly be positioned to engage LEDs as they traveled on a tape drive and test the polarity of the LEDs as they are deformed. If an LED was mounted to the tape with the incorrect polarity, the light sensor would indicate a defective LED and a marking system could be adapted to mark defective LEDs so that they are not installed on a PCB. Accordingly, the invention is not limited except as by the appended claims.

I claim:

1. A device for configuring and testing a light-emitting diode having first and second leads, comprising:

a base member having a top surface with a first deformation point defining a location about which the first lead is to be deformed and a second deformation point defining a location about which the second lead is to be deformed;

a guide on the base member, the guide corresponding to a position of the light-emitting diode in a test and configuration position in which the first and second leads are positioned proximate to the first and second deformation points, respectively;

a first peg connected to the base at the first deformation point;

a first conductive contact element positioned to engage the first lead in the test and configuration position, the first conductive contact element being coupled to a first terminal of a power supply;

a second peg connected to the base at the second deformation point; and a second conductive contact element positioned to engage the second lead in the test and configuration position, the second conductive contact element being coupled to a second terminal of a power supply, wherein the first and second leads are configured by deforming the first and second leads about the first and second pegs, respectively.

2. The device of claim 1 wherein the first conductive contact element is the first peg and the second conductive contact element is the second peg.

3. The device of claim 1 wherein the first conductive contact element is a component of the first peg.

4. The device of claim 3 wherein the component of the first peg is a first deformation element attached to the first peg at the first deformation point.

5. The device of claim 1, further comprising an insulated third peg having a third deformation element positioned at a third deformation point defining a location about which a third lead is to be deformed.

6. The device of claim 1 wherein the guide is a structure into which the light-emitting diode is positioned and retained in the test and configuration position.

7. A device for configuring and testing an electrical polarity of a multi-color light-emitting diode having a first lead, a common lead and a second lead, comprising:

a base member having a top surface with a first deformation point at which the first lead is to be deformed, a second deformation point at which the common lead is to be deformed, and a third deformation point at which the second lead is to be deformed;

a guide on the base member, the guide having a size and shape corresponding to a position of the light-emitting diode in a test and configuration position at which the first lead, the common lead, and the second lead are proximate to the first, second, and third deformation points, respectively;

a first peg attached to the base at the first deformation point;

a first conductive contact element positioned to engage the first hot lead in the test and configuration position, the first conductive element being coupled to a first terminal of a power supply;

a second peg attached to the base at the second deformation point;

a second conductive contact element positioned to engage the common lead in the test and configuration position, the second conductive contact element being coupled to a second terminal of the power supply; and an insulated third peg attached to the base at the third deformation point, wherein the polarity of the light emitting diode is tested by energizing the first conductive contact element as it contacts the first lead, and wherein the first lead, the common lead, and the second lead are configured by deforming the first lead, the common lead, and the second lead about the first, second, and third pegs, respectively.

8. The device of claim 7 wherein the first conductive contact element is the first peg and the second conductive contact element is the second peg.

9. The device of claim 7 wherein the first conductive contact element is a component of the first peg and the second conductive contact element is a component of the second peg.

10. The device of claim 9 wherein the first conductive contact element is a first deformation element attached to the first peg at the first deformation point, and wherein the second conductive contact element is a second deformation element attached to the second peg of the second contact point.

11. The device of claim 7 wherein the first peg further comprises a first insulated contact element to bias the common lead against the second deformation element and the first conductive contact element is a first deformation element attached to the first peg at the first deformation point, and wherein the second peg further comprises a second insulated contact element positioned to electrically isolate the second lead from other conductive components and the second conductive contact element is a second deformation element attached to the second peg at the second deformation point.

12. The device of claim 7 wherein the first conductive contact element comprises a fourth peg positioned to engage the first lead in a test position and disengage the first lead after the first lead has been configured about the first peg.

13. The device of claim 12 wherein the first peg is insulated, and wherein the second conductive element is the second peg.

14. The device of claim 12 wherein the first peg is insulated, and wherein the second peg further comprises a second insulated contact element to electrically isolate the second lead, and the second conductive contact element is a second deformation element attached to the second peg at the second deformation point.

15. The device of claim 7 wherein the guide is a structure into which the light-emitting diode is positioned and retained in the test and configuration position.

* * * * *